United States Patent
Marshall

(10) Patent No.: US 7,512,163 B2
(45) Date of Patent: Mar. 31, 2009

(54) DUAL CURRENT CONTROL FOR LASER DIODE DRIVER CIRCUIT

(75) Inventor: James C. Marshall, Puyallup, WA (US)

(73) Assignee: Microsoft Corporation, Redmond, WA (US)

( * ) Notice: Subject to any disclaimer, the term of this patent is extended or adjusted under 35 U.S.C. 154(b) by 169 days.

(21) Appl. No.: 11/241,935

(22) Filed: Oct. 4, 2005

(65) Prior Publication Data
US 2007/0091946 A1    Apr. 26, 2007

(51) Int. Cl.
*H01S 3/00* (2006.01)
(52) U.S. Cl. .............. 372/38.02; 372/38.07; 372/38.01; 372/38.09
(58) Field of Classification Search ............. 372/38.01, 372/38.02, 38.03, 38.04, 38.05, 38.06, 38.07, 372/38.08, 38.09
See application file for complete search history.

(56) References Cited

U.S. PATENT DOCUMENTS

| | | | | |
|---|---|---|---|---|
| 4,807,239 | A * | 2/1989 | Takano et al. .............. | 372/38.03 |
| 4,819,241 | A * | 4/1989 | Nagano .................... | 372/38.03 |
| 5,274,361 | A * | 12/1993 | Snow ......................... | 345/166 |
| 5,397,933 | A | 3/1995 | Yamada | |
| 5,414,280 | A | 5/1995 | Girmay | |
| 5,485,300 | A * | 1/1996 | Daley ......................... | 398/197 |
| 5,526,164 | A | 6/1996 | Link et al. | |
| 5,633,489 | A * | 5/1997 | Dvorkis et al. ......... | 235/462.43 |
| 5,963,570 | A * | 10/1999 | Gnauck et al. ........... | 372/38.01 |
| 6,108,114 | A | 8/2000 | Gilliland | |
| 6,496,526 | B1 | 12/2002 | McIntyre | |
| 6,587,490 | B2 | 7/2003 | Crawford | |
| 2003/0035451 | A1 * | 2/2003 | Ishida et al. ............. | 372/38.02 |
| 2003/0138010 | A1 | 7/2003 | Herz | |
| 2004/0114694 | A1 * | 6/2004 | Kroeger et al. .............. | 375/295 |
| 2004/0189603 | A1 * | 9/2004 | Arrigo et al. ................ | 345/158 |
| 2004/0246460 | A1 * | 12/2004 | Auracher et al. .......... | 356/4.01 |
| 2005/0162391 | A1 | 7/2005 | Lin | |

FOREIGN PATENT DOCUMENTS

WO    WO 2005/041370    6/2005

OTHER PUBLICATIONS www.gyration.com/ultragt.htm, pp. 1-3, Aug. 17, 2005.
www.logitech.com/index/cfm/products/details/CA/EN,CRID=2135,CONTENTID=9043, pp. 1-4, Aug. 17, 2005.

(Continued)

*Primary Examiner*—Minsun Harvey
*Assistant Examiner*—Xnning Niu
(74) *Attorney, Agent, or Firm*—Shook, Hardy & Bacon LLP

(57) ABSTRACT

Circuitry for reliably regulating the current driving a laser diode or other current-driven load is described. In particular, a dual-current driver circuit is described that uses both a current source circuit and a current sink circuit. The current source circuit and the current sink circuit may each independently control the laser diode drive current within a desired operating tolerance. The current driving the laser diode will be maintained within tolerance despite the failure of either the current source circuit or the current sink circuit. This is because the current source circuit and the current sink circuit are combined with the laser diode in series, such that the current driving the laser diode will be controlled at the lower of the two currents driven by the current source circuit and the current sink circuit.

12 Claims, 3 Drawing Sheets

OTHER PUBLICATIONS www.semiconductors.philips.com/cgi-bin/pldb/pip/TZA3047B.html, pp. 1-6, Aug. 17, 2005.

www.d-silence.com/story.php?headline_id=21428&comment=1, pp. 1-4, Aug. 17, 2005.

* cited by examiner

US 7,512,163 B2

DUAL CURRENT CONTROL FOR LASER DIODE DRIVER CIRCUIT

BACKGROUND

Laser diodes used in consumer devices today are supposed to be limited to produce light within prescribed safety levels. Because laser light is coherent and highly directional, laser light can easily injure one's eye even at relatively low light levels. Despite precautions that are taken to maintain laser light within safe operating levels, there is a concern that light from a laser diode may still present a safety hazard in certain situations, such as where a fault has occurred in the circuit driving the laser diode. Because a laser diode emits light in an amount that depends upon the amount of electric current passing through the laser diode (also referred to as the amount of current driving the laser diode), current driver circuits have been developed for regulating the electric current passing through laser diodes. Such current driver circuits should allow the laser diode to operate with sufficient optical power over a defined environmental envelope of operation throughout the life of the product. This balance between performance and safety can result in the need for tight operating tolerances for the current driver circuit. For example, a current driver circuit may be required to produce optical power within a range of plus-or-minus five percent of a desired optical power.

In addition, a current driver is often designed to maintain a proper current even where a component in the current driver fails. Typically, a current driver circuits that allow for a relatively wide operating tolerance are protected with limiting circuits that have limiting resistors. However, such limiting circuits are not always appropriate. For example, where a current driver circuit can operate over a wide range of power supply voltages or forward voltages across the laser diode, such limiting circuits can allow undesirably large increases in current to occur.

SUMMARY

There is a need for an improved way to reliably regulate the current passing through a laser diode or other current-driven load. A dual-current driver circuit is described that uses both a current source circuit and a current sink circuit. The current source circuit and the current sink circuit may each independently control the laser diode current within a desired operating tolerance, such as within plus and minus five percent of their respective desired driving currents (which ideally would be the same). The current driving the laser diode will be maintained within tolerance despite the failure of either the current source circuit or the current sink circuit. This is because the current source circuit and the current sink circuit are combined with the laser diode in series, such that the current driving the laser diode will be controlled at the lower of the two currents driven by the current source circuit and the current sink circuit.

The current source and sink circuits are relatively simple and may be made from low-cost off-the-shelf components (although it may be made from other types of components if desired) and does not necessarily require development of a customized integrated circuit.

These and other aspects of the disclosure will be apparent upon consideration of the following detailed description of illustrative embodiments.

BRIEF DESCRIPTION OF THE DRAWINGS

The foregoing summary, as well as the following detailed description of illustrative embodiments, is better understood when read in conjunction with the accompanying drawings, which are included by way of example, and not by way of limitation with regard to the claimed invention.

DETAILED DESCRIPTION OF ILLUSTRATIVE EMBODIMENTS

Figure 1:
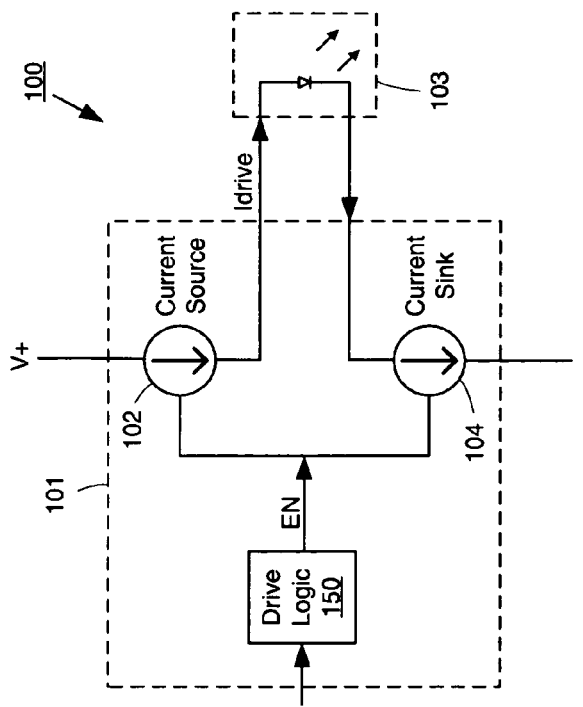
FIG. 1 is an illustrative functional block diagram of an apparatus including a laser diode, current driver circuitry for driving the laser diode, and drive logic for selectively enabling the current driver.

Referring to FIG. 1, an apparatus 100 is shown having a current driver 101 that regulates a drive current Idrive through a current-driven load 103, which in this embodiment is a laser diode. Current driver 101 has both a constant current source 102 and a constant current sink 104, both of which are in series with laser diode 103. Current source 102 and current sink 104 are each independently configured to regulate current Idrive to be a constant predetermined current regardless of the load of laser diode 103, within a predetermined operating tolerance.

By providing both current source 102 and current sink 104 in series with laser diode 103, an extra measure of safety may be achieved. This is because, even if one of current source 102 or current sink 104 fails to properly regulate current Idrive, current Idrive will be controlled to be the lower of the two regulated currents. For example, assume that both current source 102 and current sink 104 are configured, when operating properly, to provide a constant current Idrive of 5 mA, plus-or-minus 0.25 mA. Further assume, however, that either current source 102 or current sink 104 has failed and is now attempting to provide a constant current Idrive of 12 mA. This higher current, if actually passed through laser diode 103, may cause an excessive amount of laser light to be emitted, possibly causing a safety hazard. However, in the present embodiment, because the non-faulting one of current source 102 or current sink 104 is still trying to regulate current Idrive at 5 mA, then that is all the current that will be available. Thus, the lower of the two currents (5 mA) will be provided to laser diode 103. If the faulting circuit caused current Idrive to be even lower than 5 mA, then the lower current would be driven through laser diode 103. However, this would not be a safety concern.

Figure 3:
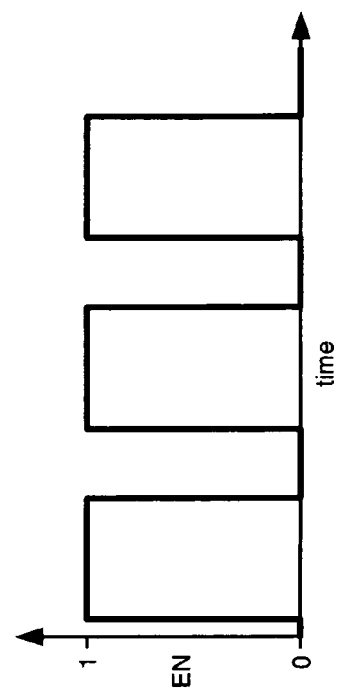
FIG. 3 is an illustrative graph showing an on-and-off pattern over time of an enable signal used to enable or disable the current driver of FIG. 1.

Current driver 101 in this embodiment also has drive logic 150, which may selectively enable and disable current source 102 and/or current sink 104 as desired via an enable signal EN, the state of which effectively controls whether or not current Idrive is generated. The purpose of drive logic 150 is to provide a duty cycle of laser diode 103 that is less than 100%. However, if only a duty cycle of 100% is desired, then the circuitry of FIG. 1 may not include drive logic 150. Drive logic 150 may be simple circuitry and/or it may be implemented as a processor chip, such as a microprocessor. It may be useful for drive logic 150 to control current Idrive to have a duty cycle that is less than 100% in order to conserve power, especially where apparatus 100 is used in a portable device environment and powered by a portable battery. For example, as shown in FIG. 3, enable signal EN may be controlled by drive logic 150 to switch between an enabled state 1 and a disabled state 0 in a periodic and sequential manner. When signal EN is in the enabled state, current Idrive is generated. When signal EN is in the disabled state, current Idrive is not generated. The duty cycle is the percentage of time that signal EN is in the enabled state. In the present example, the duty cycle is approximately 65%. However, any duty cycle may be used. Also, although current Idrive is not generated at all in this example when signal EN is in the disabled state, the circuitry may be easily modified such that a smaller amount of current Idrive is generated when signal EN is in the disabled state as compared with when signal EN is in the enabled state. Although a logical 1 is used in this example to designate the enable state and a logical 0 is used to designate the disable state, this may be reversed.

Figure 2:
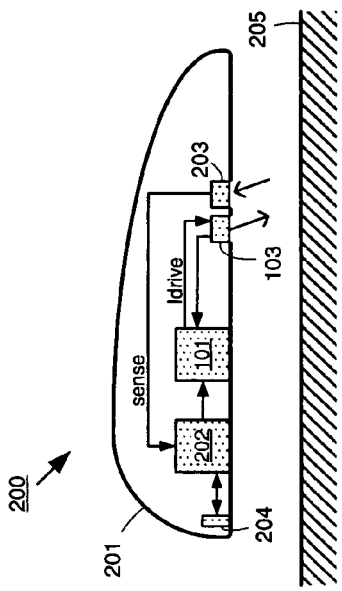
FIG. 2 is an illustrative side cut-away view of a mouse including the current driver and laser diode of FIG. 1.

An example of a portable device that may implement apparatus 100 is shown in FIG. 2. In this example, a mouse 200 is shown. As is well-known, a mouse is typically used to provide user input to a computer. As shown, mouse 200 includes current driver 101 and laser diode 103, as well as a controller 202, a light sensor 203, and a wireless signal port 204 for communicating with a computer or other device to which user input is to be sent (not shown). Current driver 101, laser diode 103, controller 202, light sensor 203, and/or signal port 204 may each be partially or fully disposed within a housing 201. The light sensor may consist of a photo array, and the resulting control signal may represent the effect of analog and/or digital processing of information received by elements in the photo array. Any combination of the elements described herein may be integrated into a single package such as an integrated circuit package. In addition, one or more lenses may be disposed in the illuminating path, i.e., between the laser diode and the illuminated surface, as well as in the return path, i.e., between the illuminating surface and the light sensor.

In this example, controller 202 controls current driver 101 to selectively drive laser diode 103. Controller 202 may do this by controlling drive logic 150. Alternatively, controller 202 may include drive logic 150 and thus produce signal EN directly. Controller 202 may be simple circuitry and/or it may be implemented as a processor chip, such as a microprocessor. In operation, when laser diode 103 generates laser light, the light is reflected off of a surface 205 (which is shown physically separated from housing 201 but which is practice may actually be much closer to, and even come into contact with, housing 201). The reflected light is detected by light sensor 203, which is configured to detect at least the frequency of the laser light that is emitted by laser diode 103. In response to detecting the reflected light, light sensor 203 sends a signal, called herein "sense," to controller 202. Where light sensor 203 is a photo array, the sense signal may represent the present states of elements in the photo array, and/or states that depend upon historical states such as those states representing motion measured and processed over sequential repeated images taken by the photo array. Light sensor 203 may further sense the brightness of the image in the return path, and, in response to a change in brightness, controller 202 may adjust the amount of current applied to laser diode 103. Thus, the sense signal at least provides information related to the movement of mouse 200 relative to surface 205. In response, controller 202 may process the sense signal and generate another signal based on the sense signal. This other signal, which may be formatted in such a manner that it is usable by the computer (such as to conform with a Uniform Serial Bus, or USB, connection), is forwarded to signal port 204. Signal port 204, in turn, conveys the formatted signal (which in this case is a wireless RF or infrared signal, for example) to the computer. Although signal port 204 is, in this example, a wireless port such as an antenna, it may alternatively be a wired signal port having a wire coupled to the computer. In either case, a function of signal port 204 is to convey the signal generated by controller 202 from a location within housing 201 to a location outside of housing 201, such that the signal is accessible by the computer or other intended destination.

Also, as shown in the present embodiment, laser diode 103 is configured to direct light outside the housing away from the lower flat surface of housing 201, and light sensor 203 is configured to receive the reflected light directed toward the same lower flat surface. In other words, light sensor 203 is configured to detect light directed in such a direction that it is incident on the same lower flat surface of housing 201. In addition, laser diode 103 and light sensor 203 as shown are attached to the lower flat surface of housing 201 and/or otherwise physically close to the lower flat surface than to any other surface of housing 201. However, other physical positioning and configurations of laser diode 103 and light sensor 203 may be used. In addition, although a mouse has been discussed with regard to FIG. 2, other consumer or industrial electronic devices may incorporate some or all of the circuitry of FIG. 1.

Figure 4:
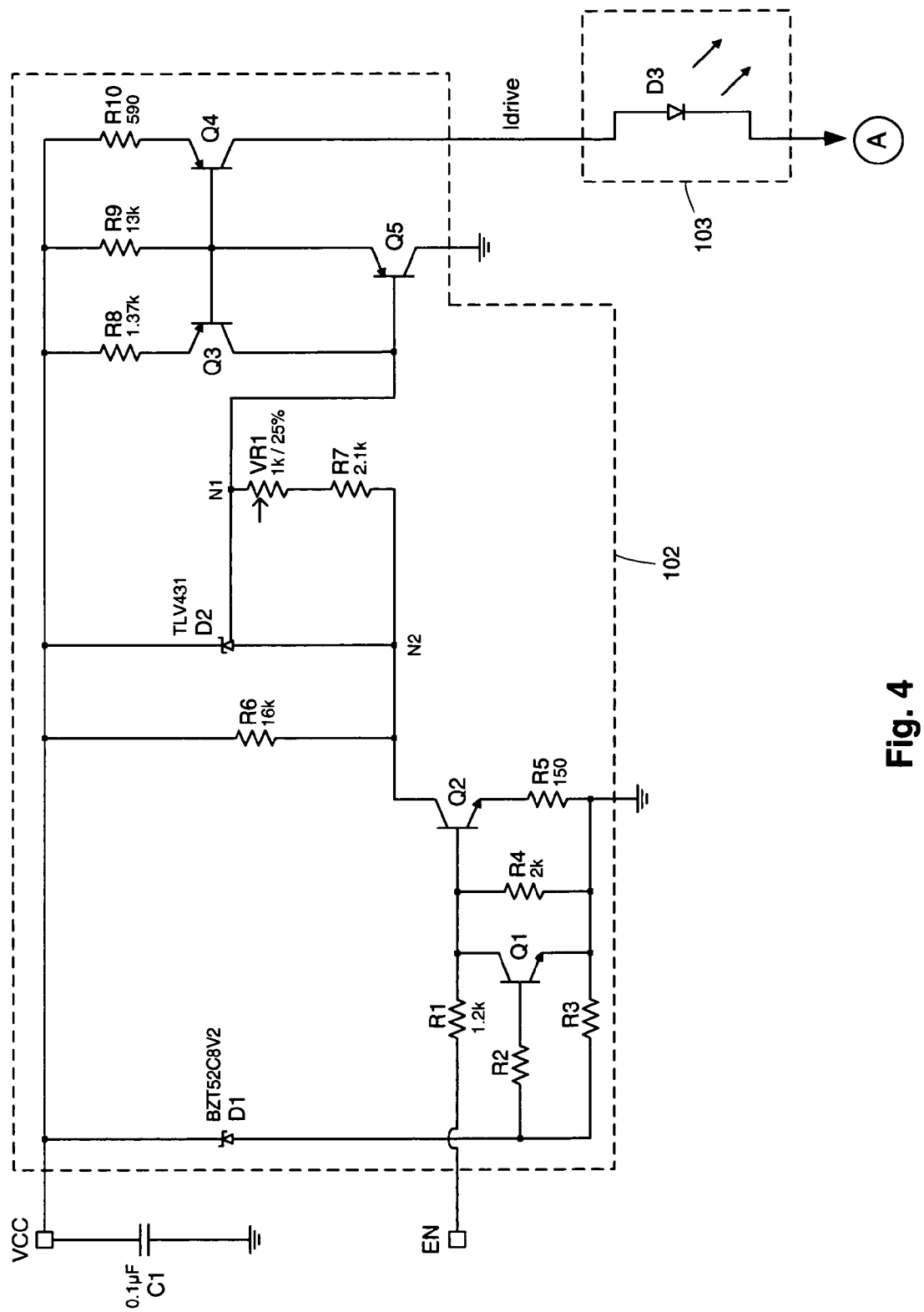
FIG. 4 is an illustrative schematic diagram of a current source used in the current driver of FIG. 1.
Figure 5:
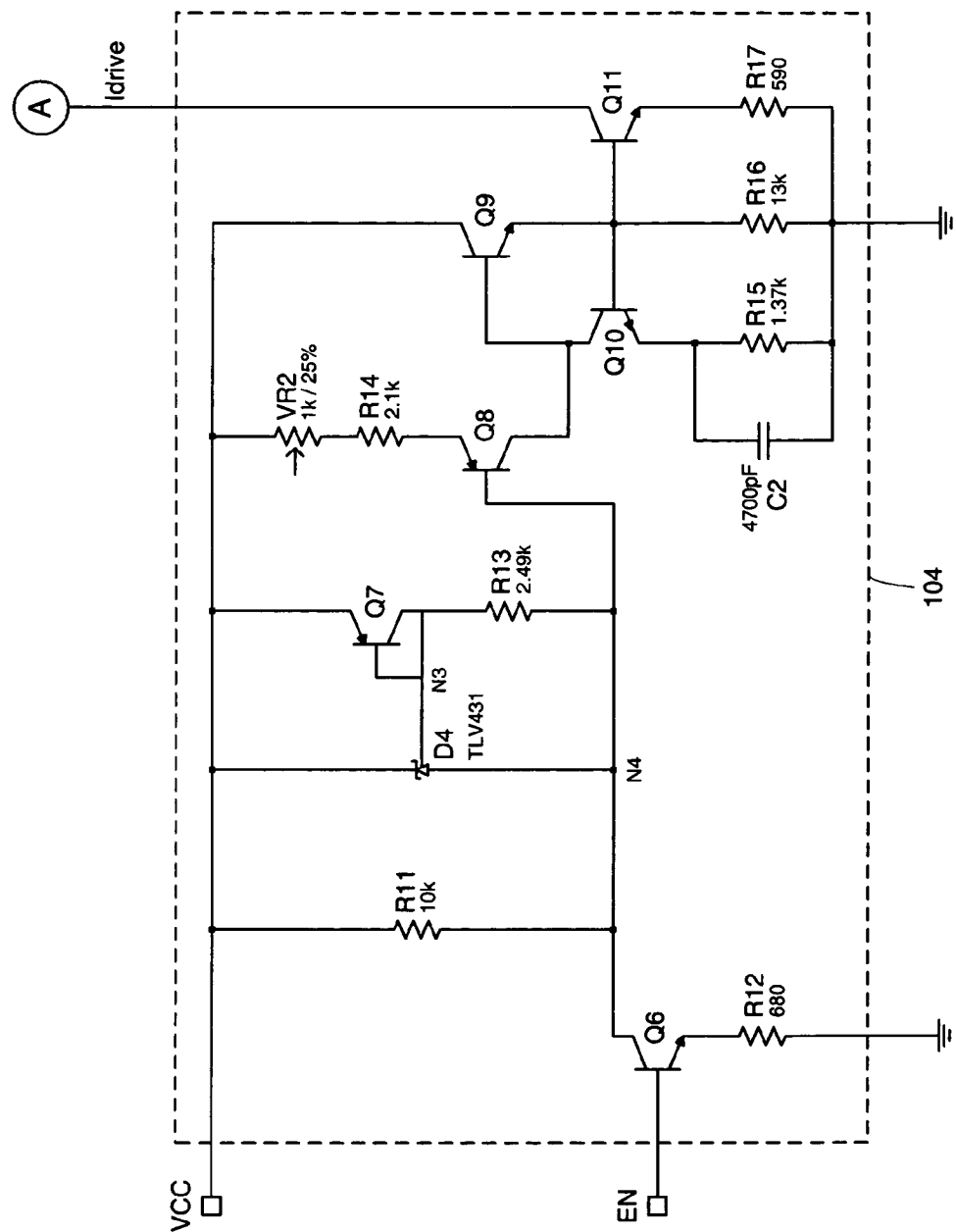
FIG. 5 is an illustrative schematic diagram of a current sink used in the current driver of FIG. 1.

Current source 102 and current sink 104 may be made from one or more off-the-shelf individual components (such as individually-packaged transistors, capacitors, and resistors), off-the-shelf integrated circuits, and/or custom-designed integrated circuits. Constant current sources and constant current sinks are, individually, well-known circuits. There are many variations on how these may individually be implemented. An example of a circuit schematic of current source 102 (along with laser diode 103) is shown in FIG. 4, and an example of a circuit schematic of current sink 104 receiving the regulated current of current source 102 from laser diode 103 is shown in FIG. 5. It will be understood that current sources and current sinks may be created in a variety of ways as is well known in the art, and that the schematics of FIGS. 4 and 5 are merely illustrative.

Referring to FIG. 4, current source 102 has a plurality of transistors Q1-Q5, a plurality of fixed resistors R1-R10, a variable resistor VR1, and a capacitor C1, interconnected as shown. Current source 102 in this example also uses two integrated circuits, which are respectively used as diode D1 and shunt regulator D2.

A direct current source voltage VCC (such as about 4V to 5.5V) is supplied to current source 102, with capacitor C1 being used to filter out any unwanted high frequency voltage transients on the power supply voltage. Diode D1 receives VCC, but disables current source 102 in response to VCC exceeding a particular voltage level (such as about 8.8V) by turning on transistor Q1. Also, enable signal EN is received by current source 102 at resistor R1, which feeds into the base of transistor Q2. Transistor Q2 controls the bias current for shunt regulator D2 by selectively allowing current to pass through D2 depending upon the state of EN.

Thus, when EN is high, transistor Q2 and shunt regulator D2 are turned on. When shunt regulator D2 is turned on, it pulls whatever current is necessary and available to maintain a stable predefined reference voltage between nodes N1 and N2, which in this example is about 1.24V.

Transistor Q5 acts as a current amplifier and supplies the necessary current to turn on transistors Q3 and Q4. Transistors Q3 and Q4 together act as a current mirroring circuit, ultimately causing current Idrive to be controlled by and pass through transistor Q4.

Current Idrive then passes through laser diode 103, also referred to in FIG. 4 as D3. After passing through laser diode 103, current Idrive continues on FIG. 5 via the line labeled "A."

Referring to FIG. 5, current sink 104 is made up of transistors Q6-Q11, resistors R11-17, variable resistor VR2, and capacitor C2, interconnected as shown. Current sink 104 in this example also uses an integrated circuit, which is used as a shunt regulator D4. The integrated circuit embodying shunt regulator D4 may be the same integrated circuit as, or a different integrated circuit from, the integrated circuit that embodies shunt regulator D2 in FIG. 4.

In operation, enable signal turns on or off transistor Q6, which in turn enables or disables shunt regulator D4. When shunt regulator D2 is turned on, it pulls whatever current is necessary and available to maintain a stable predefined reference voltage between nodes N3 and N4, which in this example is about 1.24V. The resulting voltage across resistor R13 is followed across resistors R14 and VR2 in order to provide a precise reference current out the collector of Q8. Transistor Q9 acts as a current amplifier and supplies the necessary current to turn on transistors Q10 and Q11.

Transistors Q10 and Q11 together act as a current mirroring circuit amplifying the reference current and ultimately causing current Idrive to be controlled by and pass through transistor Q11.

Thus, both transistor Q4 in current source 102 and transistor Q11 in current sink 104 attempt to force current Idrive to a particular level. Ideally, the forced current levels for both transistors Q4 and Q11 should be equal. However, in reality they may be slightly different from each other. The circuit that attempts to force the higher current saturates as necessary to supply the lower current, such that current Idrive is the lower of the two currents.

In addition resistor R10 in current source 102 and resistor R17 in current sink 104 may be set to particular same resistances that depend upon the characteristics of the particular type of laser diode 103 or other load being driven. In the present example, both resistors R10 and R17 are set to 590 ohms, which in these circuits works well for an Ulm Photonics VCSEL (vertical cavity surface-emitting laser) diode. As another example, resistors R10 and R17 may be set to 66.5 ohms, which has been found to work well for an Osram Opto Semiconductors VCSEL diode. Thus, by choosing the appropriate value for resistors R10 and R17, the particular circuits shown in FIGS. 4 and 5 are flexible enough to work with laser diodes from a variety of manufacturers. Tighter output current tolerance than can be achieved with the discrete components operating alone may be achieved by appropriately adjusting variable resistors VR1 and/or VR2.

Although particular values of resistances, capacitances, voltages, and currents have been referred to herein, other values may be used, depending upon the actual implementation of the current source and sink circuits. Also, there are many possible configurations for the current source and current sink circuits beyond the circuit in the present embodiment, with tighter or looser operating load current tolerance requirements. Such configurations include circuits having current sensing elements for each of the current source and sink circuits; circuits having analog feedback and control of the current source and sink rather than digital on/off control of the current source and sink; and circuits having one or more non-current sensors (such as optical sense elements built into the laser diode) that provide feedback control to a current source and a current sink circuit.

Thus, an improved way to reliably regulate the current passing through a laser diode or other current-driven load has been disclosed, using both a current source circuit and a current sink circuit in series with the load.

What is claimed is:

1. Apparatus for utilizing laser light in a controlled manner, comprising;
    a current source circuit configured to regulate a current to a first level;
    a current sink circuit configured to regulate the current to a second level;
    a laser diode electrically coupled in series between the current source circuit and the current sink circuit, and configured to have the current pass through the laser diode at a lower one of the current being driven by the current source circuit at the first level or the current being driven by the current sink circuit at the second level,
    wherein the current source circuit and the current sink circuit are configured to each independently maintain the laser diode within a desired predetermined operating tolerance despite the failure of either the current source circuit and the current sink circuit, and
    wherein the predetermined operating tolerance comprises a range of plus or minus five percent about the current at the first level or about the current at the second level;
    a sensor configured to detect light at a same frequency as light generated by the laser diode, and to generate a first signal in response to detecting the light; and
    a controller configured to repeatedly and sequentially enable, and then disable, the current source circuit and the current sink circuit, such that the current is repeatedly and sequentially increased and decreased.

2. The apparatus of claim 1, wherein the controller is further configured to receive the first signal and to generate a second signal based on the first signal, and wherein the apparatus further includes:
    a housing, wherein the current source circuit, the current sink circuit, the laser diode, and the sensor are each at least partially disposed within the housing; and
    a signal port configured to convey the second signal from a location within the housing to a location outside the housing.

3. The apparatus of claim 2, wherein the housing includes a substantially flat surface, and wherein the laser diode is configured to direct light outside the housing away from the flat surface and the sensor is configured to receive light having a direction that is incident on the flat surface.

4. Apparatus for utilizing laser light in a controlled manner, comprising:
    a first circuit configured to generate a current;
    a laser diode coupled to the first circuit such that the current passes through the laser diode;
    a sensor configured to detect light at a same frequency as light generated by the laser diode, and to generate a first signal in response to detecting the light; and
    a second circuit configured to receive the current after being emitted from the laser diode, wherein the first circuit, the laser diode, and the second circuit are connected in series,
    wherein the first circuit is further configured to regulate the current being passed into the laser diode to a first level regardless of a load of the laser diode within a predetermined operating tolerance, and wherein the second circuit is further configured to regulate the current being emitted from the laser diode to the first level regardless of a load of the laser diode within a predetermined operating tolerance.

5. Apparatus for utilizing laser light in a controlled manner, comprising;
- a current source circuit configured to regulate a current to a first level;
- a current sink circuit configured to also regulate the current to a second level;
- a laser diode electrically coupled in series with the current source circuit and the current sink circuit, and configured to generate light upon having the current pass through the laser diode at a lower one of the current being driven by the current source circuit at the first level or the current being driven by the current sink circuit at the second level,
- wherein the current source circuit and the current sink circuit are configured to each independently maintain the laser diode within a desired predetermined operating tolerance despite the failure of either the current source circuit and the current sink circuit;
- a sensor configured to detect light at a same frequency as light generated by the laser diode, and to generate a first signal in response to detecting the light upon reflecting against a lower flat surface; and
- a controller configured to repeatedly and sequentially enable and disable both the current source circuit and the current sink circuit, such that the current is repeatedly and sequentially increased and decreased,
- wherein drive logic is embodied on the controller that facilitates repeatedly and sequentially enable and disable both the current source circuit and the current sink circuit via a process comprising:
    - (a) receiving and processing the first signal generated by the sensor, wherein the first signal provides information related to movement of the apparatus over the lower flat surface;
    - (b) based, in part, on the first signal, adjusting a duty cycle that governs a percentage of time an EN signal is in an enabled state; and
    - (c) providing the EN signal to the current source circuit and the current sink source in accordance with the duty cycle, thereby controlling the first level of current and the second level of current provided by the current source circuit configured and the current sink circuit, respectively.

6. The apparatus of claim 5, wherein the controller is further configured to receive the first signal and to generate a second signal based on the first signal, and wherein the apparatus further includes:
- a housing, wherein the current source circuit, the current sink circuit, the laser diode, and the sensor are each at least partially disposed within the housing; and
- a signal port configured to convey the second signal from a location within the housing to a location outside the housing.

7. The apparatus of claim 6, wherein the housing includes a substantially flat surface, and wherein the laser diode is configured to direct light outside the housing away from the flat surface and the sensor is configured to receive light having a direction that is incident on the flat surface.

8. The apparatus of claim 6, wherein the housing includes a substantially flat surface, and wherein both the laser diode and the sensor are physically closer to the substantially flat surface than to any other surface of the housing.

9. The apparatus of claim 1, wherein the first circuit is configured to regulate the current to the first level regardless of a load of the laser diode within the predetermined operating tolerance.

10. The apparatus of claim 7, wherein the second circuit is configured to regulate the current to the second level regardless of the load of the laser diode within the predetermined operating tolerance.

11. The apparatus of claim 5, wherein the current source circuit is configured to regulate the current to the first level regardless of a load of the laser diode within the predetermined operating tolerance.

12. The apparatus of claim 11, wherein the current sink circuit is configured to regulate the current to the second level regardless of a load of the laser diode within the predetermined operating tolerance.

* * * * *